(12) United States Patent
Li et al.

(10) Patent No.: US 12,304,805 B2
(45) Date of Patent: May 20, 2025

(54) PRESSURE SENSOR

(71) Applicant: UNITED AUTOMOTIVE ELECTRONIC SYSTEMS CO., LTD., Shanghai (CN)

(72) Inventors: Xibin Li, Shanghai (CN); Qishuai Gao, Shanghai (CN); Kai Huang, Shanghai (CN)

(73) Assignee: UNITED AUTOMOTIVE ELECTRONIC SYSTEMS CO., LTD., Shanghai (CN)

( * ) Notice: Subject to any disclaimer, the term of this patent is extended or adjusted under 35 U.S.C. 154(b) by 570 days.

(21) Appl. No.: 17/635,097

(22) PCT Filed: Aug. 12, 2020

(86) PCT No.: PCT/CN2020/108691
§ 371 (c)(1),
(2) Date: Feb. 14, 2022

(87) PCT Pub. No.: WO2021/027847
PCT Pub. Date: Feb. 18, 2021

(65) Prior Publication Data
US 2022/0289557 A1    Sep. 15, 2022

(30) Foreign Application Priority Data

Aug. 12, 2019 (CN) .......................... 201910740362.7

(51) Int. Cl.
*G01L 27/00* (2006.01)
*B81B 3/00* (2006.01)

(52) U.S. Cl.
CPC .......... *B81B 3/0021* (2013.01); *G01L 27/007* (2013.01); *B81B 2201/0264* (2013.01); *B81B 2207/07* (2013.01); *B81B 2207/09* (2013.01)

(58) Field of Classification Search
CPC .......... B81B 3/0021; B81B 2201/0264; B81B 2207/07; B81B 2207/09; G01L 19/0038;
(Continued)

(56) References Cited

U.S. PATENT DOCUMENTS

| 2012/0006119 A1 | 1/2012 | Broden et al. |
| 2017/0315009 A1 | 11/2017 | Riethmueller et al. |
| 2021/0088400 A1* | 3/2021 | Hammerschmidt .... G01L 13/00 |

FOREIGN PATENT DOCUMENTS

| CN | 103512630 A | 1/2014 |
| CN | 104483062 A | 4/2015 |

(Continued)

*Primary Examiner* — Robert R Raevis
(74) *Attorney, Agent, or Firm* — Muncy, Geissler, Olds & Lowe, P.C.

(57) ABSTRACT

A pressure sensor (100) includes a pressure measuring device (120) including: a circuit board (121); and a processing unit (122) and a detection unit, both provided on the circuit board (121); the detection unit includes first, second and third MEMS sensing elements (123, 124, 125); the first MEMS sensing element (123) is configured to sense a first pressure (P1) at a first target position; the second MEMS sensing element (124) is configured to sense a second pressure (P2) at a second target position, and the third MEMS sensing element (125) is configured to sense a pressure difference (ΔP) between the first and second target positions; the processing unit (122) is configured to determine whether the three MEMS sensing elements (123, 124, 125) are abnormal based on the first and second pressures and on the pressure difference; if it is determined that at least one of the three MEMS sensing elements is abnormal, the processing unit (122) outputs abnormal diagnostic information; if it is determined that none of the three MEMS sensing elements is abnormal, the processing unit (122) outputs information about the pressure(s) at the first and/or second target position(s) and the pressure difference; thus rationality (Continued)

diagnosis of the pressure signals is achieved, resulting in increased reliability and accuracy in pressure measurement.

14 Claims, 5 Drawing Sheets

(58) Field of Classification Search
CPC ..... G01L 19/143; G01L 27/007; G01L 15/00; G01L 13/06
USPC .......................... 73/1.57, 1.71, 431; 340/626
See application file for complete search history.

(56) References Cited

FOREIGN PATENT DOCUMENTS

| CN | 208223708 U | | 12/2018 | |
|---|---|---|---|---|
| CN | 109655194 A | | 4/2019 | |
| CN | 110501110 A | * | 11/2019 | ........... B81B 3/0021 |
| JP | H08128911 A | | 5/1996 | |
| JP | 2013531255 A | | 8/2013 | |
| JP | 2017015657 A | | 1/2017 | |

* cited by examiner

PRESSURE SENSOR

TECHNICAL FIELD

The present invention relates to the technical field of pressure measurement and, more particularly, to a pressure sensor.

BACKGROUND

In order to conform to the increasingly stringent particulate emission regulations, particulate filters (including gasoline particulate filters (GPFs) and diesel particulate filters (DPFs)) are promoted for wider use in internal combustion engines in order to reduce particulate emissions from vehicles. In order to ensure that a particulate filter can normally operate as required by on-board diagnostics (OBD), it is necessary to monitor a pressure difference between upstream and downstream of the particulate filter and an absolute pressure downstream thereof. To this end, pressure sensors are being increasingly used in vehicles, where they are exposed to engine exhaust emissions to sense those pressure values.

Although existing pressure sensors can be used to measure a pressure difference between upstream and downstream of a particulate filter and a pressure downstream thereof, they are not able to evaluate the rationality of these pressure signals. Therefore, if such a pressure sensor develops a fault (e.g., a zero point shift, an abnormal slope, etc.), pressure signals that it outputs may be ineligible. Therefore, it is necessary to diagnose the rationality of such pressure signals before they are output, thereby enabling more reliable and more accurate pressure detection.

SUMMARY OF THE INVENTION

It is an object of the present invention to provide such a pressure sensor that is capable of diagnosing the rationality of pressure signals and thus providing increased reliability and accuracy in pressure measurement.

To achieve the above object, the present invention provides a pressure sensor, comprising a casing and a pressure measuring device hermetically housed in the casing, wherein the pressure measuring device comprising: a circuit board; and a processing unit and a detection unit which are provided on the circuit board, wherein the detection unit comprises three MEMS sensing elements that are a first MEMS sensing element, a second MEMS sensing element and a third MEMS sensing element; the first MEMS sensing element is configured to sense a first pressure at a first target position and feed the first pressure back to the processing unit, the second MEMS sensing element is configured to sense a second pressure at a second target position and feed the second pressure back to the processing unit, and the third MEMS sensing element is configured to sense a pressure difference between the first position and the second target position and feed the pressure difference back to the processing unit;

wherein the processing unit is configured to determine whether the three MEMS sensing elements are abnormal based on the first pressure, the second pressure and the pressure difference, if it is determined at least one of the three MEMS sensing elements is abnormal, output abnormal diagnostic information, and if it is determined none of the three MEMS sensing elements is abnormal, output the pressure information at the first target position and/or the pressure information at the second target position and the pressure difference information.

Optionally, the processing unit comprises a master processor chip and a slave processor chip communicatively coupled to the master processor chip;

wherein the master processor chip is configured to acquire information about the pressure difference sensed by the third MEMS sensing element, the slave processor chip is configured to acquire information about both the first pressure sensed by the first MEMS sensing element and the second pressure sensed by the second MEMS sensing element and feed the information about the first pressure and the second pressure back to the master processor chip, the master processor chip is further configured to calculate a pressure difference between the first pressure and the second pressure, derive information about the calculated pressure difference, compare the information about the calculated pressure difference with the information about the sensed pressure difference, output the diagnostic information if the comparison indicates inequality, and output the information about the pressure at the first target position and/or the pressure at the second target position and the pressure difference if the comparison indicates equality.

Optionally, the pressure measuring device further comprises an output interface electrically connected to the circuit board, wherein the diagnostic information comprises a fault code, wherein the master processor chip is configured to, if the comparison indicates inequality, produce the fault code, encode the fault code as a first SENT signal and output the first SENT signal at the output interface, and wherein the master processor chip is further configured to, if the comparison indicates equality, encode the information about the pressure at the first target position and/or the pressure at the second target position and the pressure difference as a second SENT signal and output the second SENT signal at the output interface.

Optionally, the output interface is an interface for the SENT digital protocol, and comprises a fast transmission channel and a slow transmission channel, the fast transmission channel configured for transmission of the information about the pressure(s) and the pressure difference, the slow transmission channel configured for transmission of the diagnostic information and other information.

Optionally, the output interface comprises three pins that are a ground pin, a power supply pin and a signaling pin, the signaling pin configured for transmission of the following information: the diagnostic information, the information about the pressure(s), the information about the pressure difference, and other information.

Optionally, the output interface further comprises a housing extending outwardly from an outer wall of the casing, and wherein the pins are enclosed in the housing.

Optionally, the first MEMS sensing element, the third MEMS sensing element and the processing unit are all provided on a front side of the circuit board, and the second MEMS sensing element is provided on a back side of the circuit board, and wherein the pressure measuring device further comprises a protective structure having an internal cavity in which the three MEMS sensing elements are provided so that a protective gel filled in the internal cavity of the protective structure covers the respective MEMS sensing elements.

Optionally, the protective gel is a fluorinated silica gel.

Optionally, the pressure measuring device comprises at least two protective structures, and wherein both the first MEMS sensing element and the third MEMS sensing element are provided in one of the protective structures, and the second MEMS sensing element is provided in another one of the protective structures.

Optionally, the protective structure is a plastic frame that is fixed to the circuit board so as to surround the MEMS sensing elements.

Optionally, the protective structure is a recess provided in a surface of the circuit board.

Optionally, the first MEMS sensing element, the third MEMS sensing element and the processing unit are all provided on a front side of the circuit board, and the second MEMS sensing element is provided on a back side of the circuit board;

the casing defines therein a first chamber, a second chamber and a third chamber, which are separated from one another, the first MEMS sensing element and the third MEMS sensing element are arranged in the first chamber, the second MEMS sensing element is arranged in the second chamber, the processing unit is arranged in the third chamber, the first chamber is separated from the second chamber by the third MEMS sensing element;

the first MEMS sensing element has a surface configured to be able to sense a pressure of an object under measurement that has entered the first chamber, and another surface configured to be exposed to a vacuum;

the second MEMS sensing element has a surface configured to be able to sense a pressure of an object under measurement that has entered the second chamber, and another surface configured to be exposed to a vacuum; and the third MEMS sensing element has a surface configured to be able to sense a pressure of an object under measurement that has entered the first chamber, and another surface configured to be able to sense a pressure of an object under measurement that has entered the second chamber, so that the third MEMS sensing element can directly obtain a difference between the pressures.

Optionally, the first MEMS sensing element, the third MEMS sensing element and the processing unit are all provided on a front side of the circuit board, and the second MEMS sensing element is provided on a back side of the circuit board;

the casing defines therein a first chamber, a second chamber and a third chamber, which are separated from one another, the first MEMS sensing element and the third MEMS sensing element are arranged in the first chamber, the second MEMS sensing element is arranged in the second chamber, the processing unit is arranged in the third chamber, the first chamber is separated from the second chamber by the third MEMS sensing element;

the first MEMS sensing element has a surface configured to be able to sense a pressure of an object under measurement that has entered the first chamber, and another surface configured to be exposed to the ambient atmosphere;

the second MEMS sensing element has a surface configured to be able to sense a pressure of an object under measurement that has entered the second chamber, and another surface configured to be exposed to the ambient atmosphere; and the third MEMS sensing element has a surface configured to be able to sense a pressure of an object under measurement that has entered the first chamber, and another surface configured to sense a pressure of an object under measurement that has entered the second chamber, so that the third MEMS sensing element can directly obtain a difference between the pressures.

Optionally, the circuit board in the first chamber has a surface in which a through hole extending through the circuit board is formed, and the though hole is in communication with the second chamber, and wherein the third MEMS sensing element is provided at the through hole so that the object under measurement that has entered the second chamber passes through the through hole and acts on the other surface of the third MEMS sensing element.

Optionally, the casing comprises a base and a cover, the base defining therein the second chamber;

wherein the cover is provided on an inner side thereof with a separator which delimits the first and third chambers in the base when the cover is fitted with the base, and wherein the second chamber is separated from the first chamber and the third chamber by the circuit board.

Optionally, the pressure measuring device further comprises peripheral circuit provided on a front side of the circuit board;

wherein the front side of the circuit board comprises a first portion and a second portion, the first portion exposed in the first chamber, the second portion exposed in the third chamber;

wherein the first MEMS sensing element and the third MEMS sensing element are both provided on the first portion, wherein the processing unit and the peripheral circuit are both provided on the second portion, and wherein the surface of the first portion has no electroplated wiring.

Optionally, the casing further comprises a first pipeline and a second pipeline, both of which are provided on the base, and wherein the first pipeline is in communication with the first chamber, and the second pipeline is in communication with the second chamber.

Optionally, the casing further comprises a mounting flange provided on the base.

Optionally, the circuit board is a ceramic printed circuit board which has a structure with at least two layers and provided therein with wires, wherein the components on opposing sides of the ceramic printed circuit board are electrically coupled by the wires, and wherein the three MEMS sensing elements are coupled to the ceramic printed circuit board through gold wire bonding.

In comparison with the prior art, the pressure sensor of the present invention includes a pressure measuring device which is hermetically housed in a casing and includes a circuit board as well as a processing unit and a detection unit which are both provided on the circuit board. The detection unit includes three MEMS sensing elements for detecting a pressure at a first target position and/or a pressure at a second target position and a pressure difference. For example, when the pressure sensor is used with a particulate filter, it can measure a pressure difference between upstream and downstream of the particulate filter and a pressure downstream thereof. In particular, before information about the pressure (s) and the pressure difference is output, the processing unit can diagnose the rationality of the pressure signals. Once at least one of the three MEMS sensing elements is found to develop an abnormality, it is determined that the pressure signals are abnormal, and the information about the pressure (s) and the pressure difference is not output. This results in increased reliability and accuracy in pressure measurement and allows the pressure sensor to better satisfy pressure measurement requirements. Further, the pressure sensor of the present invention is simple in structure, easy to use and capable of pressure measurement at lower cost.

BRIEF DESCRIPTION OF THE DRAWINGS

The accompanying drawings are provided to facilitate a better understanding of the present invention and do not unduly limit the scope thereof in any sense. In these figures.

FIG. 1b is an assembled view of the pressure sensor of FIG. 1a;

Figure 1A:
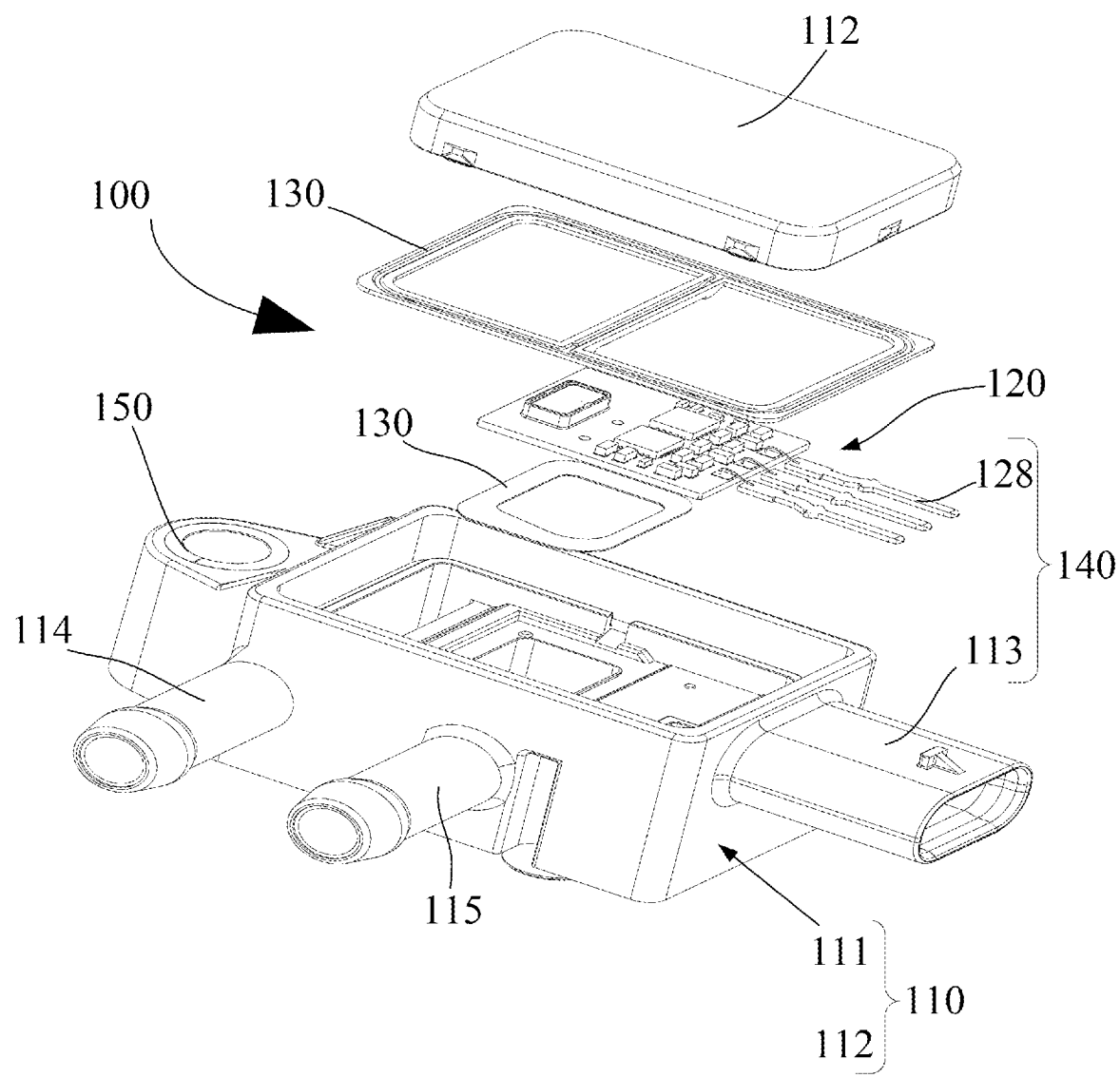
FIG. 1a is an exploded view of a pressure sensor according to an embodiment of the present invention.

IN THESE FIGS 100, a pressure sensor;
110, a casing;
111, a base;
112, a cover;
113, a housing;
114, a first pipeline;
115, a second pipeline;
116, a first chamber;
117, a second chamber;
118, a third chamber;
120, a pressure measuring device;
121, a circuit board;
122, a processing unit;
1221, a master processor chip;
1222, a slave processor chip;
123, a first MEMS sensing element;
124, a second MEMS sensing element;
125, a third MEMS sensing element;
126, a protective gel;
127, a plastic frame;
128, pins;
129, a through hole;
130, a glue;
140, an output interface;
150, a mounting flange.

DETAILED DESCRIPTION

The present invention will be described in greater detail below with reference to the accompanying schematic drawings, which present preferred embodiments of the invention. It is to be appreciated that those skilled in the art can make changes to the invention disclosed herein while still obtaining the beneficial results thereof. Therefore, the following description shall be construed as being intended to be widely known by those skilled in the art rather than as limiting the invention.

As used herein and in the appended claims, the singular forms "a", "an" and "the" include plural referents, unless the context clearly dictates otherwise. As used herein and in the appended claims, the term "or" is generally employed in the sense including "and/or", unless the context clearly dictates otherwise. As used herein and in the appended claims, the terms "multiple" and "several" are generally employed in the sense including "two or more", unless the context clearly dictates otherwise.

For the sake of clarity, not all features of an actual implementation are described in this specification. In the following, description and details of well-known functions and structures are omitted to avoid unnecessarily obscuring the invention. It should be appreciated that in the development of any such actual implementation, numerous implementation-specific decisions must be made to achieve specific goals of the developers, such as compliance with system-related and business-related constrains, which may vary from one implementation to another. Moreover, it should be appreciated that such a development effort might be complex and time consuming, but would nevertheless be a routine undertaking for those of ordinary skill in the art.

The present invention will be described in greater detail below by way of examples with reference to the accompanying drawings. Advantages and features of the present invention will become more apparent from the following description and from the appended claims. Note that the figures are provided in a very simplified form not necessarily drawn to exact scale for the only purpose of helping to explain the disclosed embodiments in a more convenient and clearer way.

The following preferred embodiments are presented to describe the present invention more clearly. It should be appreciated that the invention is not limited to the following embodiments, and any and all modifications made by those of ordinary skill in the art on the basis of the general common knowledge in this specific technical field are considered to be within the conceptual scope of the present invention.

Figure 1B:
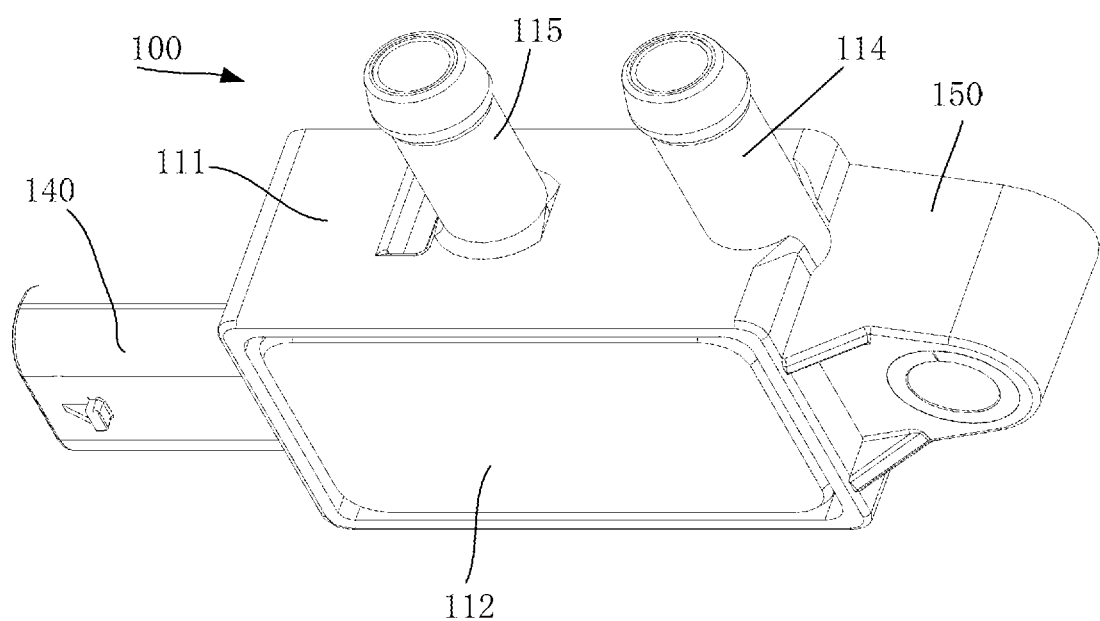

FIG. 1a is an exploded view of a pressure sensor 100 according to an embodiment of the present invention, and FIG. 1b is an assembled view of the pressure sensor 100 of FIG. 1a. As shown in FIGS. 1a and 1b, the pressure sensor 100 of this embodiment includes a casing 110 and a pressure measuring device 120 hermetically housed in the casing 110. According to the present invention, the pressure sensor 100 is used primarily in a vehicle to monitor a pressure difference between upstream and downstream of a particulate filter and a pressure downstream thereof. However, according to the present invention, the pressure sensor 100 is not limited to that use only. Indeed, it can be used in any similar application in need of pressure measurement.

In the following, the pressure sensor 100 will be further described as being used to monitor a pressure difference between upstream and downstream of a particulate filter in a vehicle and a pressure downstream thereof as an example, but one skilled in the art may be able to modify the following description to make it suitable for use in another application than a particulate filter.

The pressure sensor 100 may be used in a vehicle equipped with a particulate filter on its exhaust pipeline. Depending on the type of the vehicle, the particulate filter may be either a gasoline particulate filter (GPF) or a diesel particulate filter (DPF). The pressure sensor 100 is exposed to exhaust emissions from the vehicle (i.e., deployed in an erosive environment). The pressure sensor 100 is able to monitor in real time a pressure difference between upstream and downstream of the particulate filter and a pressure downstream thereof. This enables timely determination of timing for regenerating the particulate filter. Triggering regeneration of the particulate filter at the determined timing can effectively reduce the vehicle's particulate emissions to a final level desirable for on-board diagnostics (OBD).

With continued reference to FIGS. 1a and 1b, the casing 110 includes a base 111 and a cover 112, which, when fitted together, define a hermetic space. The casing 110 is preferably made of a fiberglass-reinforced material such as polyphenylene sulfide (PPS) or polybutylene terephthalate (PBT), which possesses good resistance properties. In this embodiment, the cover 112 is preferably bonded to a side wall or an end face of the base 111 using glue 130. The glue 130 is preferably a high temperature resistant, erosion resistant silica gel with good resistance properties. Of course, if the pressure sensor 100 is not used in an erosive environment, there may not be any particular requirement imposed on the overall resistance of the device to environmental elements. Additionally, the pressure measuring device 120 may be overall fixed to the casing 110 using the glue 130. This allows easy handling and convenient assembly.

Figure 2:
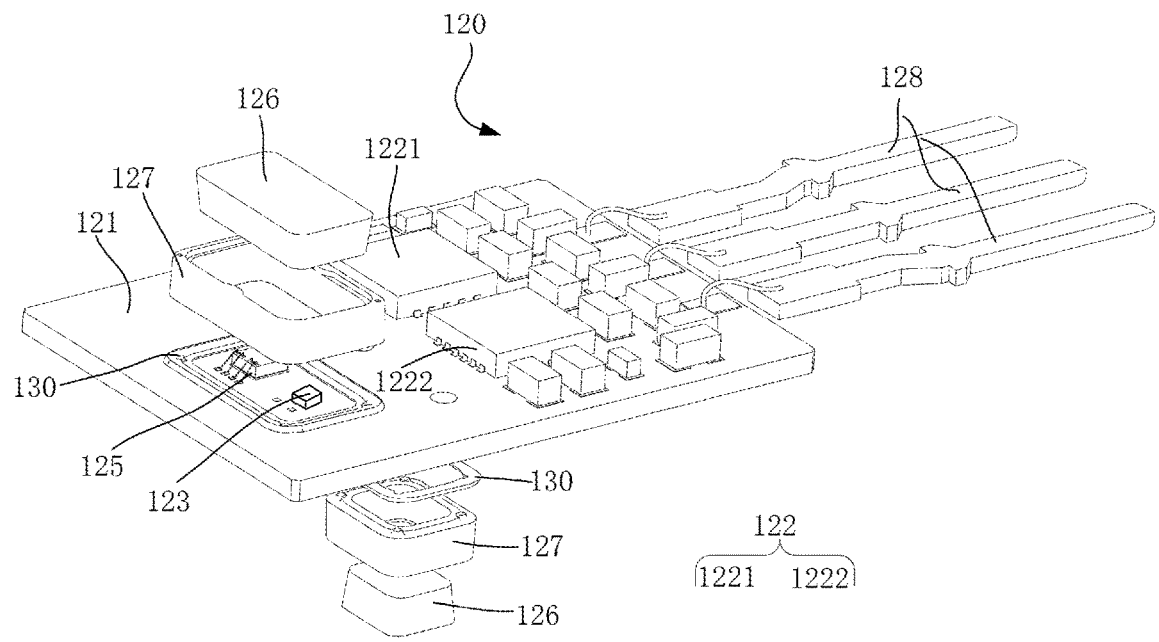
FIG. 2 is an exploded partial view of a pressure measuring device according to an embodiment of the present invention.
Figure 3:
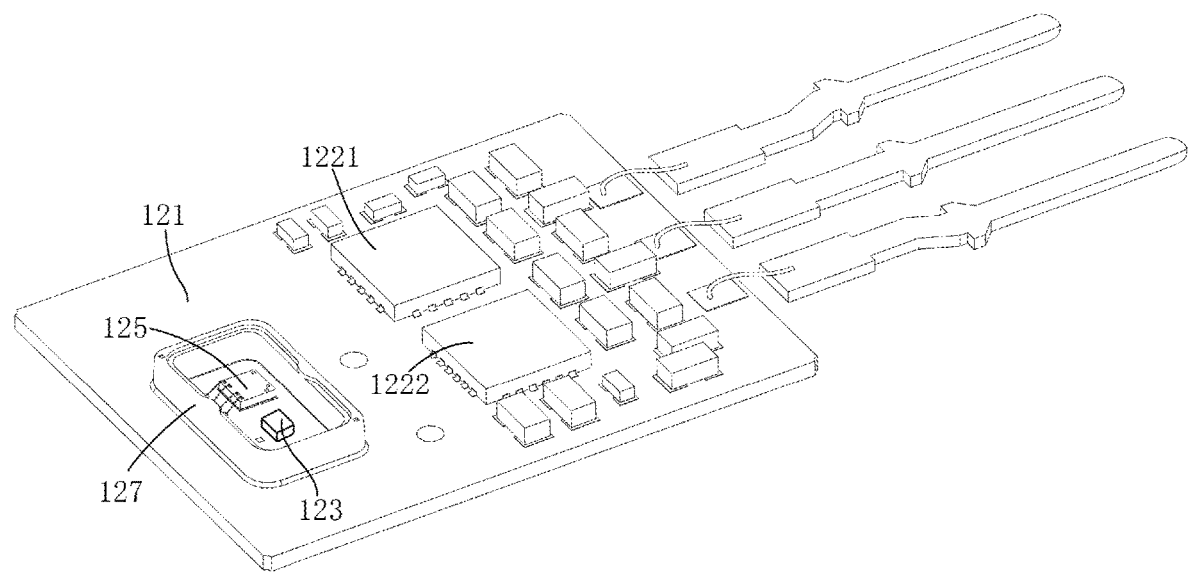
FIG. 3 is a schematic view showing the front side of the pressure measuring device according to an embodiment of the present invention.
Figure 4:
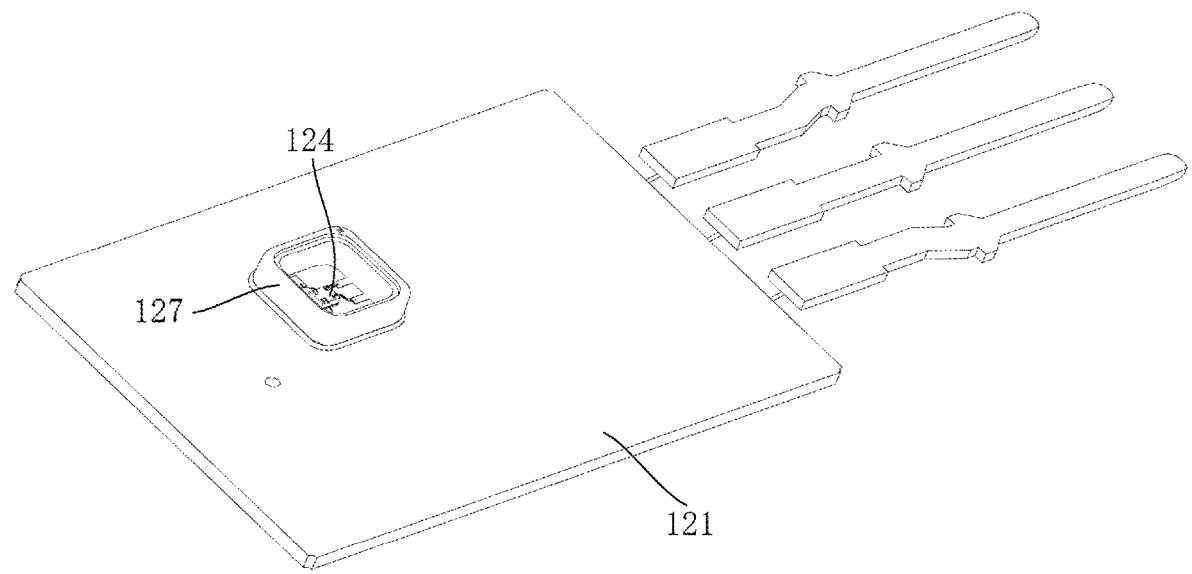
FIG. 4 is a schematic view showing the back side of the pressure measuring device according to an embodiment of the present invention.

The pressure measuring device 120 is a key component of the pressure sensor 100 and is structured as shown in FIGS. 2 to 4. FIG. 2 is an exploded partial view of the pressure measuring device 120 according to an embodiment of the present invention. FIG. 3 is a schematic view showing the front side of the pressure measuring device 120 shown in FIG. 2. FIG. 4 is a schematic view showing the back side of the pressure measuring device 120 shown in FIG. 2.

Specifically, the pressure measuring device 120 includes a circuit board 121, as well as a processing unit 122 and a detection unit, which are both provided on the circuit board 121. The detection unit includes a first MEMS sensing element 123, a second MEMS sensing element 124 and a third MEMS sensing element 125. All these MEMS sensing elements are electrically coupled to the processing unit 122 via the circuit board 121. Preferably, the circuit board 121 is a ceramic printed circuit board which provides a range of advantages including high mechanical strength, a small coefficient of thermal expansion and good resistance to environmental elements. Therefore, the use of the ceramic printed circuit board can effectively ensure a long service life and good stability of the pressure sensor and can ensure desirable pressure measurement accuracy by better avoiding interference with pressure measurement. More preferably, the ceramic printed circuit board is a high temperature co-fired ceramic (HTCC) or low temperature co-fired ceramic (LTCC) printed circuit board, which possesses even better erosion resistance, thermal expansion performance, high temperature resistance, mechanical strength and other performance and can thus better match the requirements of applications. Moreover, the HTCC or LTCC circuit board is a multilayer structure (having at least two layers) incorporating multiple internal wiring layers (preferably, four wiring layers) that facilitate electrical connection of electrical components on both sides of the circuit board 121 and thus enable integration of the three MEMS sensing elements on the circuit board 121. This can reduce the overall size of the device, simplify the structure of the casing and result in lower cost. However, the circuit board 121 may be alternatively made of FR-4, FR-5, BT or another material, which enables the circuit board 121 to have good mechanical and dielectric properties and high heat and corrosion resistance and thus to be suitable for use in an erosive environment.

The circuit board 121 has opposing front and back sides. The processing unit 122, as well as both the first 123 and third 125 MEMS sensing elements, is attached to the front side of the circuit board 121, whilst the second MEMS sensing element 124 is attached to the back side of the circuit board 121. With this design, it is easy for the first MEMS sensing element 123 to sense a gas pressure upstream of the particulate filter (at a first target position), so as to obtain a first pressure P1 upstream of the particulate filter. In this embodiment, the first pressure P1 may be either a relative pressure or an absolute pressure. With this design, it is also easy for the second MEMS sensing element 124 to sense a gas pressure downstream of the particulate filter (at a second target position), so as to obtain a second pressure P2 downstream of the particulate filter. Likewise, the second pressure P2 may be either a relative pressure or an absolute pressure. With this design, it is also easy for the third MEMS sensing element 125 to sense a pressure difference ΔP between upstream and downstream of the particulate filter.

In practical use, the processing unit 122 receives information about the pressures and pressure difference sensed by the three MEMS sensing elements (including the first pressure P1, the second pressure P2 and the pressure difference ΔP), digitally processes the information and transmits the processed information to an ECU through an output interface 140 detailed below. In particular, before the information is output, the processing unit 122 may diagnose the rationality of the information to determine whether the MEMS sensing elements are abnormal. If at least one of the three MEMS sensing elements is determined to be abnormal, the processing unit 122 will send to the ECU information indicating the abnormality. If none of the three MEMS sensing elements is found to be abnormal, the processing unit 122 will normally send to the ECU the information about the pressures and pressure difference sensed by the MEMS sensing elements. This embodiment is not limited to any particular content of the information sent by the processing unit 122 to the ECU, and it may contain one or more of:

1) the absolute or relative pressure sensed by the first MEMS sensing element 123;
2) the absolute or relative pressure sensed by the second MEMS sensing element 124;
3) the pressure difference sensed by the third MEMS sensing element 125; and
4) a difference between the first pressure sensed by the first MEMS sensing element 123 and the second pressure sensed by the second MEMS sensing element 124.

In other words, the pressure information output from the processing unit 122 may vary depending on the requirements of practical pressure detection applications. In the following, for ease of description, the information about the pressures and pressure difference is collectively referred to as "pressure information". It should be recognized that each of the first MEMS sensing element 123 and the second MEMS sensing element 124 may be either an absolute pressure sensing element or a relative pressure sensing element. In some embodiments, both the first MEMS sensing element 123 and the second MEMS sensing element 124 are absolute pressure sensing elements. Such embodiments are preferred because the casing is allowed to have a simplified structure. In some embodiments, both the first MEMS sensing element 123 and the second MEMS sensing element 124 are relative pressure sensing elements.

One specific implementation of the rationality diagnosis performed by the processing unit 122 on the pressure information is as follows.

First of all, the processing unit 122 calculates the difference $\Delta P'$ between the first pressure P1 and the second pressure P2, and compares $\Delta P'$ with $\Delta P$. If $\Delta P'$ is equal to $\Delta P$, then it is determined that the pressure signals are normal. That is, no abnormality is found in the three MEMS sensing elements. If $\Delta P'$ is not equal to $\Delta P$, then it is determined that the pressure signals are abnormal, and information indicating the abnormality found in the diagnosis is output.

In other words, when all the three MEMS sensing elements are functioning normally, the difference between the first pressure upstream of the particulate filter and the second pressure downstream of the particulate filter should be equal to the pressure difference measured by the pressure difference sensing element (i.e., the third MEMS sensing element). However, when at least one of the MEMS sensing elements develops an abnormality, e.g., a zero point shift, an abnormal slope, etc., the difference between the pressures upstream and downstream of the particulate filter will be no longer equal to the pressure difference measured by the pressure difference sensing element, thereby achieving a rationality diagnosis on the pressure signals.

Compared with the prior art, the rationality diagnosis on the pressure signals can result in increased reliability and accuracy in pressure measurement, more efficiently reduce particulate emissions from the vehicle and better satisfy the requirements of on-board diagnostics. Moreover, according to the present invention, rationality checking of the pressure signals is achieved by using only three MEMS sensing elements, resulting in structural simplicity of the system and low cost. Further, since the microelectromechanical systems (MEMS) sensing elements have a variety of advantages including a small size, light weight, low cost, low power consumption and high reliability, they are competent to perform the pressure measurement tasks and provide higher pressure measurement accuracy. Furthermore, through using them, the pressure sensor can have a reduced size and perform pressure measurements at lower cost.

With continued reference to FIGS. 2 and 3, the processing unit 122 preferably includes a master processor chip 1221 and a slave processor chip 1222 communicatively coupled to the master processor chip 1221. Without limitation, the two processor chips may communicate with each other using an I2C or SPI protocol. Preferably, each of the processor chips may be implemented as a digital application-specific integrated circuit (ASIC) chip. The master processor chip 1221 is configured to receive information about the pressure difference $\Delta P$ sensed by the third MEMS sensing element 125, and the slave processor chip 1222 is configured to receive information about the first pressure P1 and the second pressure P2 sensed by the first MEMS sensing element 123 and second MEMS sensing element 124, respectively. The slave processor chip 1222 is further configured to transmit the information about the first pressure P1 and the second pressure P2 to the master processor chip 1221, which then calculates the pressure difference $\Delta P'$ between the first pressure P1 and the second pressure P2 and compares information about pressure difference $\Delta P'$ with information about the pressure difference $\Delta P$. If the comparison indicates that the two pressure differences are equal, the master processor chip 1221 outputs the pressure information through the output interface 140. Otherwise, the master processor chip 1221 outputs at the output interface 140 abnormal diagnostic information. Preferably, the diagnostic information includes a fault code. That is, if the comparison indicates inequality, the master processor chip 1221 generates a fault code and preferably encodes the fault code as a SENT signal for output. More preferably, if the comparison indicates equality, the master processor chip 1221 encodes the pressure information also as a SENT signal for output. Through encoding both the diagnostic information and the pressure information as SENT signals (i.e., signals transmitted using the single edge nibble transmission (SENT) protocol), these different pieces of information can be transmitted using a single circuit, thus reducing the number of required transmission interfaces and additionally reducing the device's structural complexity and size. In this embodiment, the output interface 140 is configured for the SENT digital protocol and preferably includes a fast transmission channel and a slow transmission channel. The fast transmission channel transmits data at a rate higher than a data rate of the slow transmission channel. The diagnostic information or other information may be output through the slow transmission channel, while the pressure information may be output through the fast transmission channel. The other information may include product name information, part number information, temperature information, etc.

The MEMS sensing elements output analog electrical signals. Therefore, after these analog signals are received, the processor chips (preferably, ASIC chips) must convert them into their digital signals and subject the digital signals to a sequence of digital processing steps such as biasing, amplification, compensation and the like. The resulting signals are further subject to the above-described calculation, comparison, encoding and other processing steps. However, the present invention is not limited to any particular digital processing performed in the processor chips, and the processing steps to which the pressure signals are subject may include, but are not limited to, biasing, amplification and compensation.

In order to ensure that the MEMS sensing elements can stably operate in a harsh environment with various elements from exhaust emissions, each of them may be surface coated with a protective gel 126 (see FIGS. 2 to 4). Preferably, the protective gel 126 is a fluorinated silica gel, which has not only a soft texture that does not affect the transmission of pressures but also good resistance to environmental elements that can protect surface circuits, bond wires and the like of the MEMS sensing elements from erosion by the environmental elements. Further, the protective gel 126 can be easily applied to the surfaces of the MEMS sensing elements, providing the advantages of simple handling and easy implementation.

In addition, in order to prevent the protective gel 126 from overflowing, each of the three MEMS sensing elements may be placed within an internal cavity of a respective protective structure. In practical use, a layer of the protective gel 126 may be quickly and conveniently applied onto the surface of each MEMS sensing element simply by filling the protective gel 126 into the respective protective structure, providing the advantages of simple handling and easy implementation. In some embodiments, the protective structure may be a plastic frame 127, which is fixed to the circuit board 121 using the glue 130 so as to surround the respective MEMS sensing element. In some embodiments, the protective structure may be alternatively a recess formed in the surface of the circuit board 121. Preferably, the two MEMS sensing elements on the front side of the circuit board 121 are arranged within a single plastic frame 127 or a single recess. In this case, more specifically, as shown in FIGS. 2 and 3, the single plastic frame 127 surrounds both the first MEMS sensing element 123 and the third MEMS sensing element 125. Referring to FIG. 4, in connection with FIG. 2, another plastic frame 127 is arranged to surround the second MEMS sensing element 124.

Additionally, each of the MEMS sensing elements is preferably coupled to the circuit board 121 through gold wire bonding. More preferably, each of the MEMS sensing elements is bonded to the circuit board 121 by erosion-resistant gold wires. The excellent erosion resistance of the gold bond wires can ensure desirable connection reliability.

The aforementioned two processor chips may be attached to the front side of the circuit board 121 by means of reflow soldering and communicatively coupled to the three MEMS sensing elements via internal wires of the circuit board 121. Further, in case of digital ASIC chips, they can power the three MEMS sensing elements, carry out a sequence of digital processing steps such as biasing, amplification and compensation on feedback electrical signals from the MEMS sensing elements, and then perform calculation, comparison and encoding operations on the digitally processed signals. In this embodiment, each of the MEMS sensing element includes a thin film strain gauge and a measuring circuit integrated with the thin film strain gauge. Without limitation, the measuring circuit may be implemented as a Wheatstone bridge capable of converting a strain signal sensed by the thin film strain gauge into an electrical signal and outputting the electrical signal to a corresponding one of the digital ASIC chips. When receiving the electrical signal from the Wheatstone bridge, the corresponding digital ASIC chip may perform a sequence of processing steps thereon, such as biasing, amplification and compensation.

As described above, the master processor chip 1221 can encode the pressure information or diagnostic information indicating an abnormality as a single edge nibble transmission (SENT) signal for transmission to an electronic control unit (ECU) via a circuit. Peripheral circuit (not labeled) may be further attached to the front side of the circuit board 121. Without limitation, the peripheral circuit may include resistors, capacitors, diodes and other passive components and may be arranged depending principally on the requirements of circuit design. Preferably, the peripheral circuit and the processing unit 122 may be collocated within a specified area of the front side of the circuit board 121, with the two MEMS sensing elements also on the front side of the circuit board 121 being spaced apart from them. This separates the electronic circuits on the front side of the circuit board from the erosive measurement environment and thus ensures that these electronic circuits will not be eroded and can normally operate with high stability.

With continued reference to FIG. 1a, the output interface 140 includes a housing 113 and a number of pins 128 electrically connected to the circuit board 121. Preferably, the following three pins 128 are included: a ground pin, a power supply pin and a signaling pin. The signaling pin is configured to transmit the diagnostic information indicating an abnormality, the pressure information and other information. All the pins 128 are enclosed in the housing 113 (see FIG. 1a), and the housing 113 extends outwardly from an outer wall of the base 111. Preferably, the housing 113 is integrally formed with the base 111. In practical use, the pressure sensor 100 may communicate with the outside world via the output interface 140 (i.e., a mating terminal). Optionally, the pins 128 may be connected to the circuit board 121 by means of electric resistance welding, soldering, bond wires (e.g., aluminum wires) or press fits. In this embodiment, the pins 128 are connected to the circuit board 121 by bond wires.

A further detailed description of the pressure sensor 100 of this embodiment is set forth below with reference to FIGS. 5 to 7.

Figure 5:
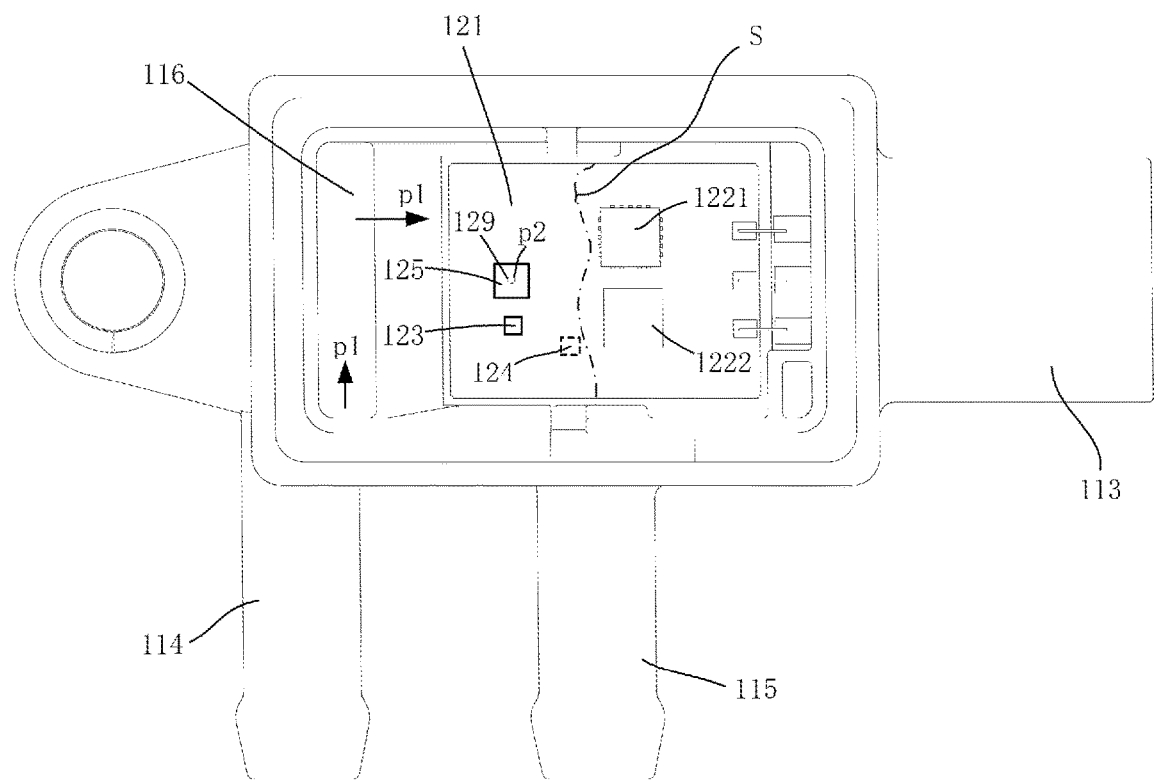
FIG. 5 is a top view of the pressure sensor with a cover being removed according to an embodiment of the present invention.
Figure 6:
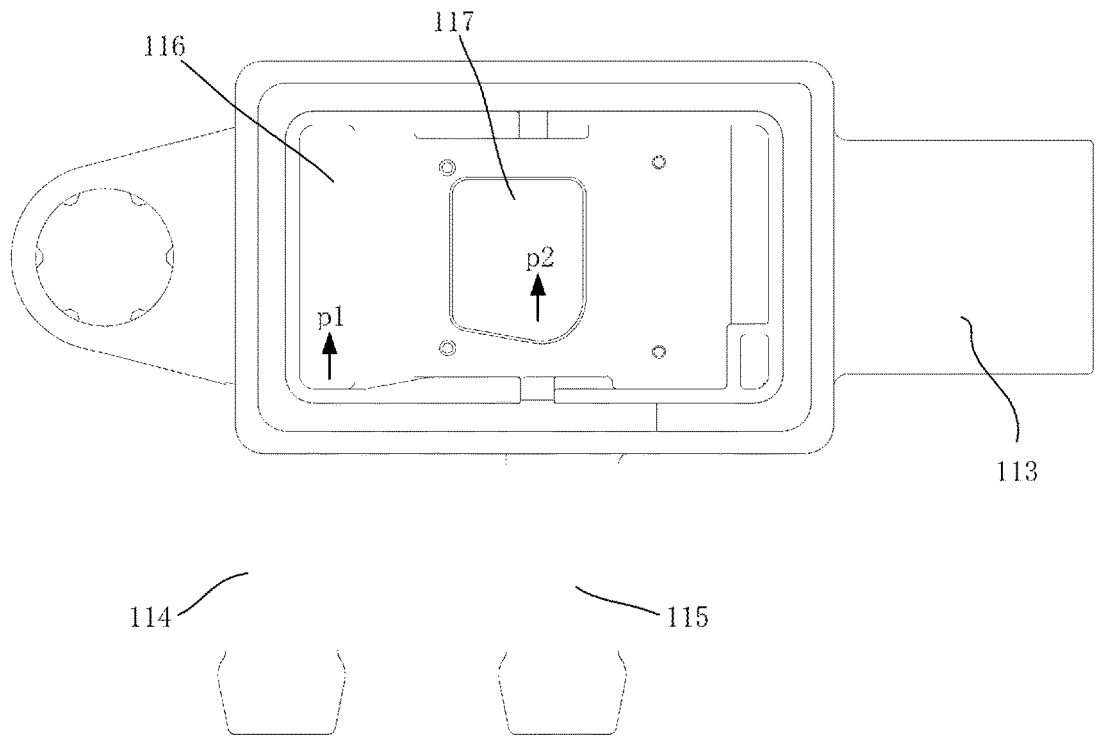
FIG. 6 is a top view of a casing with the cover thereof being removed according to an embodiment of the present invention.
Figure 7:
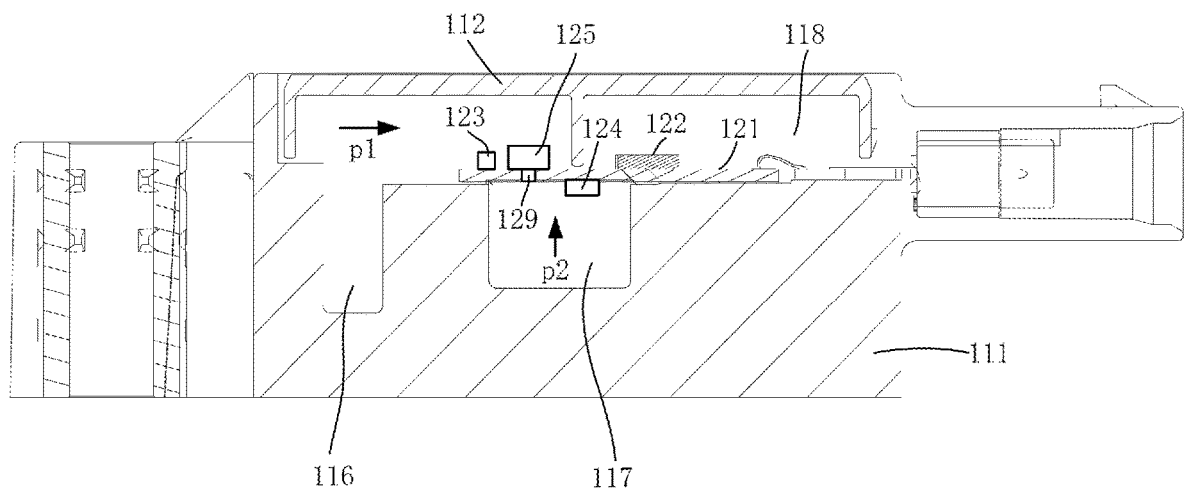
FIG. 7 is an axial cross-sectional view of the pressure sensor according to an embodiment of the present invention.

As shown in FIGS. 5 to 7, a first pipeline 114 and a second pipeline 115 are provided on the base 111. The first pipeline 114 is configured to introduce a gas from upstream of the particulate filter (indicated as p1), and the second pipeline 115 is configured to introduce a gas from downstream of the particulate filter (indicated as p2). Preferably, the first pipeline 114 and the second pipeline 115 are both integrally formed with the base 111.

Additionally, the first pipeline 114 is brought into communication with a first chamber 116 in the casing 11 so that the gas p1 introduced from upstream of the particulate filter directly enters the first chamber 116, in which the first MEMS sensing element 123 and the third MEMS sensing element 125 are both arranged so that the each of the first MEMS sensing element 123 and the third MEMS sensing element 125 can sense, at a surface thereof (e.g., its top surface), a pressure of the gas from upstream of the particulate filter.

Further, the second pipeline 115 is brought into communication with a second chamber 117 in the casing 11 so that the gas p2 introduced from downstream of the particulate filter directly enters the second chamber 117, in which the second MEMS sensing element 124 is arranged so that the second MEMS sensing element 124 can sense, at a surface thereof (e.g., its bottom surface), a pressure of the gas from downstream of the particulate filter.

Furthermore, the circuit board 121 is disposed over the second chamber 117 and provided with a through hole 129 extending therethrough to come into communication with the second chamber 117. Moreover, the third MEMS sensing element 125 is disposed at and over the through hole 129 so that the gas p2 in the second chamber 117 introduced from downstream of the particulate filter can pass through the through hole 129 and act on another surface of the third MEMS sensing element 125 (e.g., its bottom surface). In this way, the third MEMS sensing element 125 is able to sense, at the two surfaces, respectively the pressures of the gases from upstream and downstream of the particulate filter and is thus able to directly measure the difference between the pressures. It should be recognized that, in the top view of FIG. 5, the through hole 129 is invisible because it is covered by the third MEMS sensing element 125. Therefore, it is depicted with dashed lines. For the same reason, the second MEMS sensing element 124 is also depicted with dashed lines.

It should be recognized that both the first MEMS sensing element 123 and the second MEMS sensing element 124 may be absolute pressure sensing elements or relative pressure sensing elements. In case of both the first MEMS sensing element 123 and the second MEMS sensing element 124 being implemented as absolute pressure sensing elements, each of them may sense the gas pressure, for example, at its top surface, with its bottom surface being exposed to a vacuum. In this way, the pressure it measures is relative to that of the vacuum (i.e., an absolute pressure). In case of both the first MEMS sensing element 123 and the second MEMS sensing element 124 being implemented as relative pressure sensing elements, each of them may sense the gas pressure, for example, at its top surface, with its bottom surface being exposed to the ambient atmosphere. In this way, the pressure it measures is relative to the ambient atmospheric pressure (i.e., a relative pressure).

It is a matter of course that the first chamber 116 and the second chamber 117 are separated from each other, and the separation is accomplished by the circuit board 121. That is, the circuit board 121 covers the second chamber 117 and thus separates it from the first chamber 116. Further, considering that directly exposing the circuit board 121 to the gas introduced from upstream of the particulate filter into the first chamber 116, which is typically an exhaust gas from the vehicle's engine, tends to lead to erosion of the circuit board, a third chamber 118 may be further provided in the casing 11. In this case, all the chambers are spaced apart and separated from one another. In particular, the processing unit 122 and the peripheral circuit (including passive components) may be both disposed in the third chamber 118, while the first MEMS sensing element 123 and the third MEMS sensing element 125 may be both arranged in the first chamber 116.

Preferably, the front side of the circuit board 121 includes a first portion exposed in the first chamber 116 and a second portion exposed in the third chamber 118. The first portion is not electrified (i.e., has no electroplated wiring), while the second portion is electrified (i.e., has electroplated wiring). Further, the processing unit 122 and the peripheral circuit or other related circuits are all provided on the electrified second portion. Accordingly, only the first and third MEMS sensing elements are disposed on the first portion. Since the first portion is not provided thereon with any other electronic component or any circuit line exposed on the surface, it can be directly exposed in the first chamber 116 without worry about any undesired erosive effect. At the same time, since the second portion of the circuit board 121 and the electronic circuits thereon are avoided from direct exposure to an exhaust gas from the vehicle's engine, it is ensured that they can normally operate with high stability.

As shown in FIG. 7, when the cover 112 is fitted with the base 111, a separator arranged on an inner side of the cover 112 may partition the internal space of the base 111 into the first chamber 116 and the third chamber 118, while the second chamber 117 is formed in the base 111 and separated from these two chambers by the circuit board 121. This design allows the casing 11 to be simple in structure and results in good resistance of the entire device to environmental elements.

Further, a mounting flange 150 for fixing the pressure sensor 100 to the vehicle may be provided on the base 111. Optionally, the mounting flange 150 may be arranged in opposition to the output interface 140.

Preferably, assembly of the pressure sensor 100 of this embodiment includes:
  step 1: dispensing a glue into glue grooves inside the base 111 and placing the entire pressure measuring device 120 into the base 111;
  step 2: connecting the pins 128 in the output interface 140 to the circuit board 121 using aluminum bond wires;
  step 3: again dispensing a glue, preferably the same glue as used in the pressure measuring device 120, into glue grooves inside the base 111 and fitting the cover 112 with the base; and
  step 4: curing the glue at a raised temperature, thus completing the assembly.

At last, airtightness and functions of the pressure sensor 100 are tested to ensure its reliability of use. Thus, the pressure sensor 100 of this embodiment can be easily assembled and produced efficiently at low cost.

The present invention also provides a pressure measurement method on the basis of the above pressure sensor 100. The pressure sensor 100 is configured to measure a particulate filter. The pressure measurement method includes:
  sensing a first absolute pressure upstream of the particulate filter by the first MEMS sensing element 123;
  sensing a second absolute pressure downstream of the particulate filter by the second MEMS sensing element 124;
  sensing a pressure difference between upstream and downstream of the particulate filter by the third MEMS sensing element 125; and
  receiving the first absolute pressure, the second absolute pressure and the pressure difference at the processing unit 122. The processing unit 122 then calculates a pressure difference between the first absolute pressure and the second absolute pressure, and compares the pressure difference between upstream and downstream of the particulate filter sensed by the third MEMS sensing element 125 with the calculated pressure difference between the first and second absolute pressures. If the comparison indicates inequality, then the processing unit 122 outputs diagnostic information indicating an abnormality to an ECU. If the comparison indicates equality, then the processing unit 122 outputs to the ECU information about second absolute pressure downstream of the particulate filter and the pressure difference between upstream and downstream of the particulate filter.

While a few preferred embodiments of the present invention have been described above, the invention is in no way limited to the scope of the embodiments disclosed hereinabove. For example, the present invention is not limited to any particular structure of the chambers in the casing, and the above processing unit may be implemented with conventional hardware such as ASIC chips. The comparison of the pressure signals may be accomplished with a comparison circuit such as a numerical comparator, and the calculation of the pressure difference may be accomplished with a conventional computing device. These are all well known to those skilled in the art. On the basis of the teachings herein, those skilled in the art would know how to derive the pressure difference between the two sensed pressure signals using the processing unit and determine the operating condition of the MEMS sensing element from the comparison between the calculated and sensed pressure differences.

Apparently, those skilled in the art can make various changes and modifications to the present invention without departing from the spirit and scope thereof. Accordingly, it is intended that any and all such changes and modifications are embraced within the scope of the present invention as defined by the appended claims and equivalents thereof.

What is claimed is:

1. A pressure sensor, comprising a casing and a pressure measuring device hermetically housed in the casing, wherein the pressure measuring device comprising: a circuit board; and a processing unit and three sensing elements which are provided on the circuit board,
  wherein the casing defines therein a first chamber, a second chamber and a third chamber, which are separated from one another, the first sensing element and the third sensing element are arranged in the first chamber, the second sensing element is arranged in the second chamber, the processing unit is arranged in the third chamber,
  wherein the first sensing element is configured to sense a first pressure at a first target position and feed the first pressure back to the processing unit, the second sensing element is configured to sense a second pressure at a second target position and feed the second pressure back to the processing unit, and the third sensing element is configured to sense a pressure difference between the first target position and the second target position and feed the pressure difference back to the processing unit;

wherein the processing unit is configured to determine whether the three sensing elements is abnormal based on the first pressure, the second pressure and the pressure difference, if it is determined that at least one of the three sensing elements is abnormal, the processing unit outputs abnormal diagnostic information, and if it is determined that none of the three sensing elements is abnormal, the processing unit outputs pressure information at the first target position and/or pressure information at the second target position and pressure difference information.

2. The pressure sensor of claim 1, wherein the processing unit comprises a master processor chip and a slave processor chip communicatively coupled to the master processor chip;

wherein the master processor chip is configured to acquire information about the pressure difference sensed by the third sensing element, the slave processor chip is configured to acquire information about both the first pressure sensed by the first sensing element and the second pressure sensed by the second sensing element and feed the information about the first pressure and the second pressure back to the master processor chip, the master processor chip is further configured to calculate a pressure difference between the first pressure and the second pressure, derive information about the calculated pressure difference, compare the information about the calculated pressure difference with the information about the sensed pressure difference, output the diagnostic information if the comparison indicates inequality, and output the information about the pressure at the first target position and/or the pressure at the second target position and the pressure difference if the comparison indicates equality.

3. The pressure sensor of claim 2, wherein the pressure measuring device further comprises an output interface electrically connected to the circuit board, wherein the diagnostic information comprises a fault code, wherein the master processor chip is configured to, if the comparison indicates inequality, produce the fault code, encode the fault code as a first SENT signal and output the first SENT signal at the output interface, and wherein the master processor chip is further configured to, if the comparison indicates equality, encode the information about the pressure at the first target position and/or the pressure at the second target position and the pressure difference as a second SENT signal and output the second SENT signal at the output interface.

4. The pressure sensor of claim 3, wherein the output interface is an interface for the SENT digital protocol, and comprises a fast transmission channel and a slow transmission channel, the fast transmission channel configured for transmission of the information about the pressure(s) and the pressure difference, the slow transmission channel configured for transmission of the diagnostic information and other information.

5. The pressure sensor of claim 3, wherein the output interface comprises three pins that are a ground pin, a power supply pin and a signaling pin, the signaling pin configured for transmission of the following information: the diagnostic information, the information about the pressure(s), the information about the pressure difference, and other information.

6. The pressure sensor of claim 5, wherein the output interface further comprises a housing extending outwardly from an outer wall of the casing, and wherein the three pins are enclosed in the housing.

7. The pressure sensor of claim 1, wherein the first sensing element, the third sensing element and the processing unit are all provided on a front side of the circuit board, and the second sensing element is provided on a back side of the circuit board;

the first sensing element has a surface configured to be able to sense a pressure of an object under measurement that has entered the first chamber;

the second sensing element has a surface configured to be able to sense a pressure of an object under measurement that has entered the second chamber; and the third sensing element has a surface configured to be able to sense a pressure of an object under measurement that has entered the first chamber, and another surface configured to be able to sense a pressure of an object under measurement that has entered the second chamber, so that the third sensing element can directly obtain a difference between the pressures.

8. The pressure sensor of claim 7, wherein:

the first sensing element has another surface configured to be exposed to a vacuum, and the second sensing element has another surface configured to be exposed to a vacuum;

or the first sensing element has another surface configured to be exposed to an ambient atmosphere, and the second sensing element has another surface configured to be exposed to an ambient atmosphere.

9. The pressure sensor of claim 8, wherein the circuit board in the first chamber has a surface in which a through hole extending through the circuit board is formed, and the though hole is in communication with the second chamber, and wherein the third sensing element is provided at the through hole so that the object under measurement that has entered the second chamber passes through the through hole and acts on the other surface of the third sensing element.

10. The pressure sensor of claim 8, wherein the casing comprises a base and a cover, the base defining therein the second chamber;

wherein the cover is provided on an inner side thereof with a separator which delimits the first and third chambers in the base when the cover is fitted with the base, and wherein the second chamber is separated from the first chamber and the third chamber by the circuit board and the third sensing element.

11. The pressure sensor of claim 10, wherein the casing further comprises a first pipeline and a second pipeline, both of which are provided on the base, and wherein the first pipeline is in communication with the first chamber, and the second pipeline is in communication with the second chamber.

12. The pressure sensor of claim 10, wherein the casing further comprises a mounting flange provided on the base.

13. The pressure sensor of claim 8, wherein the pressure measuring device further comprises peripheral circuit provided on a front side of the circuit board;

wherein the front side of the circuit board comprises a first portion and a second portion, the first portion exposed in the first chamber, the second portion exposed in the third chamber;

wherein the first sensing element and the third sensing element are both provided on the first portion, wherein the processing unit and the peripheral circuit are both provided on the second portion, and wherein a surface of the first portion has no electroplated wiring.

14. The pressure sensor of claim 1, wherein the circuit board is a ceramic printed circuit board which has a structure with at least two layers and provided therein with wires, wherein the components on opposing sides of the ceramic printed circuit board are electrically coupled by the wires, and wherein the three sensing elements are coupled to the ceramic printed circuit board through gold wire bonding.

* * * * *